United States Patent [19]

Mihashi

[11] Patent Number: 5,311,046
[45] Date of Patent: May 10, 1994

[54] LONG WAVELENGTH TRANSMITTER OPTO-ELECTRONIC INTEGRATED CIRCUIT

[75] Inventor: Yutaka Mihashi, Itami, Japan

[73] Assignee: Mitsubishi Denki Kabushiki Kaisha, Tokyo, Japan

[21] Appl. No.: 757,803

[22] Filed: Sep. 11, 1991

[30] Foreign Application Priority Data

Nov. 19, 1990 [JP] Japan .................................. 2-316334

[51] Int. Cl.⁵ .............................................. H01L 33/00
[52] U.S. Cl. ...................................... 257/195; 257/94; 257/194
[58] Field of Search .................... 257/194, 195, 76, 94, 257/183, 617; 372/47, 50

[56] References Cited

U.S. PATENT DOCUMENTS

| | | | |
|---|---|---|---|
| 4,764,796 | 8/1988 | Sasaki et al. | 257/194 |
| 4,766,472 | 8/1988 | Brillouet et al. | 357/19 |
| 4,774,555 | 9/1988 | Kohn et al. | 257/194 |
| 4,996,163 | 2/1991 | Sasaki | 257/194 |
| 5,003,359 | 3/1991 | Abeles | 372/50 |

FOREIGN PATENT DOCUMENTS

| | | |
|---|---|---|
| 0029228 | 5/1981 | European Pat. Off. . |
| 0232662 | 8/1987 | European Pat. Off. . |
| 0386797 | 9/1990 | European Pat. Off. . |
| 3709302 | 10/1988 | Fed. Rep. of Germany . |
| 61-32588 | 2/1986 | Japan . |
| 62-244167 | 10/1987 | Japan . |
| 63-150982 | 6/1988 | Japan . |
| 1-9684 | 1/1989 | Japan . |

OTHER PUBLICATIONS

Suzuki et al, "Opto-Electronic Integrated Circuit At Long Wavelength", Second Optoelectronic Conference (OEC '88) Technical Digest, Oct. 1988, pp. 190-191.

Fukuzawa et al, "Monolithic Integration of A GaAlAs Injection Laser With A Schottky-Gate Field Effect Transistor", Applied Physics Letters, vol. 36, No. 3, 1980, pp. 181-182.

Primary Examiner—Sara W. Crane
Attorney, Agent, or Firm—Leydig, Voit & Mayer

[57] ABSTRACT

A long wavelength transmitter OEIC includes a transverse direction current injection type semiconductor laser and a high electron mobility transistor which are integrated on a semi-insulating substrate. The semiconductor laser includes at least an AlGaInAs lower cladding layer, a quantum well active layer and a high resistivity AlGaInAs upper cladding layer successively grown on the semi-insulating substrate, disordered regions formed in the quantum well active layer by diffusions of p type and n type dopants, and an active region sandwiched by the disordered regions. The transistor includes an operating layer and a carrier supplying layer both including AlGaInAs series material and formed on the high resistivity AlGaInAs upper cladding layer. This transistor uses the upper cladding layer as a leakage current preventing layer. This structure can be formed by only one epitaxial growth, resulting in low cost. In addition, since the above layers are successively grown on a flat substrate, photolithography processes for forming a gate of HEMT are performed on a flat surface, so that a fine gate pattern can be formed with high precision. As a result, a transmitter OEIC performing high speed modulation are produced.

7 Claims, 5 Drawing Sheets

LONG WAVELENGTH TRANSMITTER OPTO-ELECTRONIC INTEGRATED CIRCUIT

FIELD OF THE INVENTION

The present invention relates to a transmitter opto-electronic integrated circuit (hereinafter referred to as transmitter OEIC) in which a semiconductor laser and an electronic device are integrated. More particularly, it relates to a long wavelength transmitter OEIC in which a semiconductor laser element which oscillates at a long wavelength and an electronic switching element are integrated.

BACKGROUND OF THE INVENTION

FIG. 3 is a cross-sectional view showing a prior art long wavelength transmitter OEIC described in pages 190 and 191 of Second Optoelectronics Conference (OEC' 88) Technical Digest. In FIG. 3, reference numeral 1 designates a semi-insulating InP substrate. A semiconductor laser 17 and a field effect transistor 18 (hereinafter referred to as FET) for driving the semiconductor laser 17 are integrated on the substrate 1. An n type InGaAsP layer 14 to which an n side electrode 9 of the semiconductor laser is attached is disposed on the concave part of the InP substrate 1 which is formed by etching.

An n type InP cladding layer 2' is disposed on the n type InGaAsP layer 14. An InGaAsP active layer 3' is disposed on the ridge part of the cladding layer 2'. A p type InP cladding layer 4' is disposed on the active layer 3'. A current blocking layer 15 is disposed on the cladding layer 2' burying the ridge part. A contact layer 16 is disposed on the current blocking layer 15. A p side electrode 8 of the semiconductor laser is disposed on the contact layer 16 and an n side electrode 9 is disposed on a region of the n type InGaAsP layer 14 where the laminated-layers of the laser are not present. An undoped GaAs buffer layer 13 is disposed on a convex part of the substrate 1. An n type GaAs operating layer 5' is disposed on the buffer layer 13. A gate electrode 12 of the FET is disposed on the bottom of a recess groove formed on the operating layer 5'. A source electrode 10 and a drain electrode 11 are disposed on opposite sides of the recess groove.

Description is given of the operation hereinafter.

The n side electrode 9 of semiconductor laser 17 is connected with the source electrode 10 of FET 18 by wiring. The operations of the semiconductor laser 17 and the FET 18 are the same as those of the independent elements. More specifically, the driving current of semiconductor laser 17 is subjected to a modulation such as an interruption by a voltage applied to the gate 12 of FET 18 and the light output of semiconductor laser 17 is modulated correspondingly, thereby resulting in operation as a transmitter OEIC.

A method for manufacturing the transmitter OEIC of FIG. 3 is illustrated in FIGS. 4(a) to 4(i).

A portion of InP substrate 1 shown in FIG. 4(a) is etched away as shown in FIG. 4(b) to form a lower stage part on which the semiconductor laser 18 is to be produced. That is, in order to arrange the p side electrode 8 of semiconductor laser and the source/drain electrodes 10 and 11 of FET approximately on the same plane, the surface of substrate 1 on which the semiconductor laser comprising thick layers is to be formed is formed in a different plane from the surface on which the FET is to be formed. Then, as shown in FIG. 4(c), an n type InGaAsP layer 14 on which an electrode of the semiconductor laser is to be produced, an n type InP cladding layer 2', an InGaAsP active layer 3' and a p type InP cladding layer 4' are grown by liquid phase epitaxy (LPE), metal-organic chemical vapor deposition (MOCVD) or the like (first crystal growth). Then, unnecessary portions of cladding layer 2', active layer 3' and cladding layer 4' other than portions to be an active region of semiconductor laser are removed by photolithographic techniques and etching, resulting in a stripe-shaped mesa shown in FIG. 4(d). Thereafter, as shown in FIG. 4(e), a current blocking layer 15 and a contact layer 16 are grown by LPE (second crystal growth). Then, as shown in FIG. 4(f), unnecessary portions of the contact layer 16 and the current blocking layer 15 are removed by etching. Then, as shown in FIG. 4(g), a buffer layer 13 and a GaAs operating layer 5' of the FET are successively grown by molecular beam epitaxy (MBE) (third crystal growth). Then, as shown in FIG. 4(h), the recess portion of FET is formed by etching. Thereafter, as shown in FIG. 4(i), p side and n side electrodes 8 and 9 of semiconductor laser and the source, drain and gate electrodes 10, 11, 12 of FET are formed, thereby completing a transmitter OEIC.

As described above, three crystal growth steps are required for manufacturing the prior art long wavelength transmitter OEIC. More specifically, the first crystal growth step is for growing layers of the semiconductor laser, i.e., the n type InGaAsP layer 14, the n type InP cladding layer 2', the InGaAsP active layer 3' and the p type InP cladding layer 4', the second crystal growth step is for growing the current blocking layer 15 and the contact layer 16 after etching those layers 14, 2', 3' and 4' to form a ridge, and the third crystal growth step is for growing layers of the FET, i.e., the undoped GaAs buffer layer 13 and the n type GaAs operating layer 5'. So many crystal growth processes complicate the manufacturing process, resulting in a poor production yield and a high cost. Furthermore, in the manufacturing process, a step difference in the substrate 1 that is approximately equal to the entire thickness of the laser, i.e., 5 microns or more, inevitably arises. Such a step difference induces nonuniformity of in the photoresist films used in the photolithography process and, therefore, it is difficult to form a fine pattern FET. As a result, a high performance OEIC, for example, a high speed OEIC cannot be produced.

SUMMARY OF THE INVENTION

It is an object of the present invention to provide a long wavelength transmitter OEIC in which the layers for the semiconductor laser and for the electronic device for driving the laser are produced in only one crystal growth step, and also that has no step difference in the manufacturing process.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a long wavelength transmitter OEIC comprises a transverse direction current injection type semiconductor laser having a high resistivity upper cladding layer and a high electron mobility transistor (hereinafter referred to as HEMT) using the high resistivity upper cladding layer as a leakage current preventing buffer layer, which are integrated on a semi-insulating substrate. More specifically, the semiconductor laser includes at least an AlGaInAs lower cladding layer, a quantum well active layer and a high resistivity AlGaInAs upper cladding layer successively grown on the semi-insulating substrate, disordered regions in the quantum well active layer formed by diffusion of p type and n type dopants, and an active region sandwiched by the disordered regions. The HEMT includes an operating layer and a charge carrier supplying layer both comprising AlGaInAs series material and formed on the high resistivity AlGaInAs upper cladding layer.

Since the structure can be constructed with crystalline materials lattice-matching with the substrate, the layers for the both devices can be formed in only one crystal growth step. In addition, the electrical separation between the semiconductor laser and the HEMT can be achieved by slightly etching the thin layers of the HEMT (approximately 1000 angstroms or less in thickness) in the final stage of the manufacturing process. Therefore, the substrate has a flat surface for the lithography process of forming the gate electrode of the HEMT, and no feature, such as nonuniformity of photoresist, occurs that could reduce the performance of the device.

DETAILED DESCRIPTION OF THE PREFERRED EMBODIMENT

An embodiment of the present invention will be described in detail with reference to the drawings.

Figure 1A:
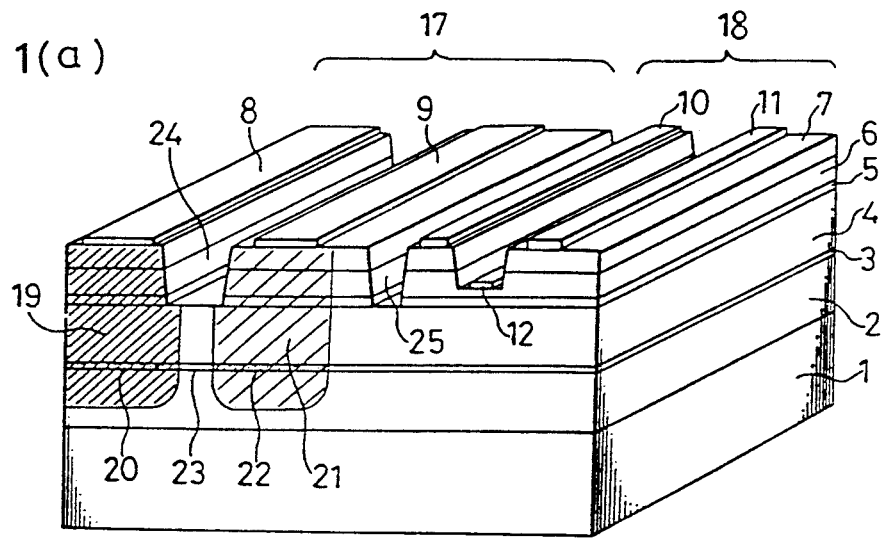
FIGS. 1(a) and 1(b) are respectively perspective view and a cross-sectional view showing a long wavelength transmitter OEIC in accordance with an embodiment of the present invention.
Figure 1B:
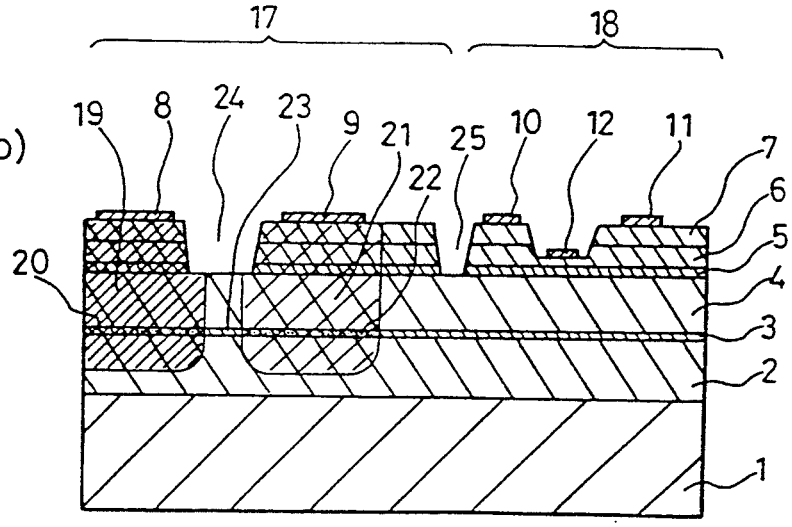

FIGS. 1(a) and 1(b) are a perspective view and a cross-sectional view showing a long wavelength transmitter OEIC in accordance with an embodiment of the present invention. In these figures, a semiconductor laser 17 and an HEMT 18 are integrated on a semi-insulating InP substrate 1. A lower AlGaInAs cladding layer 2 of the semiconductor laser is disposed on the substrate 1. A quantum well active layer 3 comprising, for example, an AlGaInAs or AlInAs barrier layers and an InGaAs well layer is disposed on the lower cladding layer 2. A high resistivity AlGaInAs cladding layer 4 is disposed on the quantum well active layer 3. An undoped InGaAs operating layer 5 of the HEMT is disposed on the upper cladding layer 4. An n type AlInAs charge carrier supplying layer 6 is disposed on the operating layer 5. An n type InGaAs contact layer 7 is disposed on the carrier supplying layer 6. A p type dopant diffused region 19 and an n type dopant diffused region 21 of the semiconductor laser are opposed to each other at a predetermined interval and penetrate through the layers from the contact layer 7 to the quantum well active layer 3 to reach into the lower cladding layer 2. A p side electrode 8 of the semiconductor laser is disposed on the contact layer 7 in the p type dopant diffused region region 19 and an n side electrode 9 is disposed on the contact layer 7 in the n type region 21. A gate electrode 12 of the HEMT is disposed on the bottom of the recess groove penetrating the contact layer 7 and reaching into the carrier supplying layer 6. Source and drain electrodes 10 and 11 of the HEMT are disposed on the contact layer 7. Regions 20 and 22 of the quantum well active layer 3 are disordered by diffusions of p type and n type dopants, respectively. An active region 23 of the semiconductor laser is sandwiched by the disordered regions 20 and 22. The p type region 19 and the n type region 21 of the semiconductor laser are separated by the groove 24 and the semiconductor laser 17 and the HEMT 18 are separated by the groove 25.

FIGS. 2(a) to 2(f) illustrate a method for manufacturing the transmitter OEIC of FIG. 1.

Figure 2A:
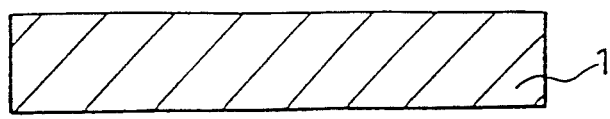
FIGS. 2(a) to 2(f) are cross-sectional views showing a method for manufacturing the long wavelength transmitter OEIC of FIG. 1(a)
Figure 2B:
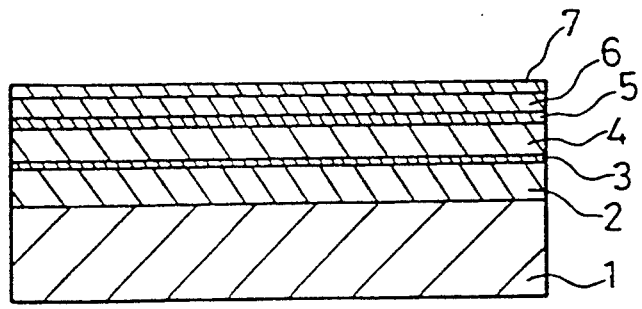
Figure 2C:
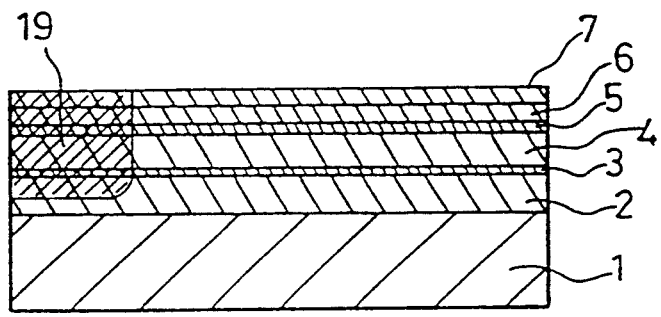
Figure 2D:
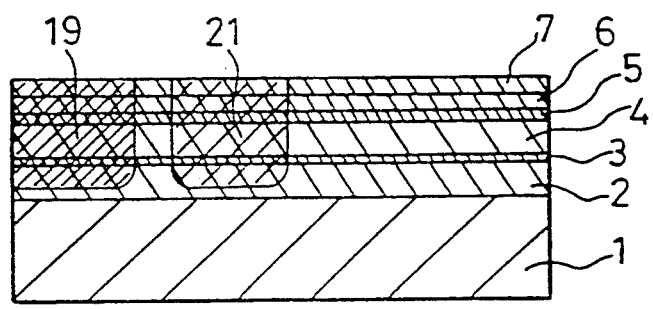
Figure 2E:
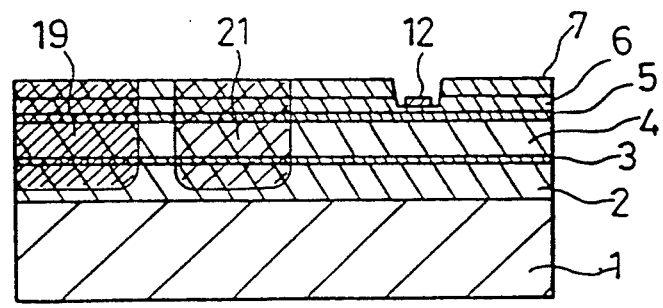
Figure 2F:
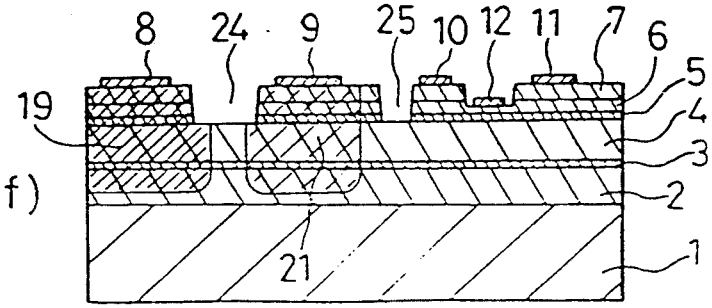
Figure 3:
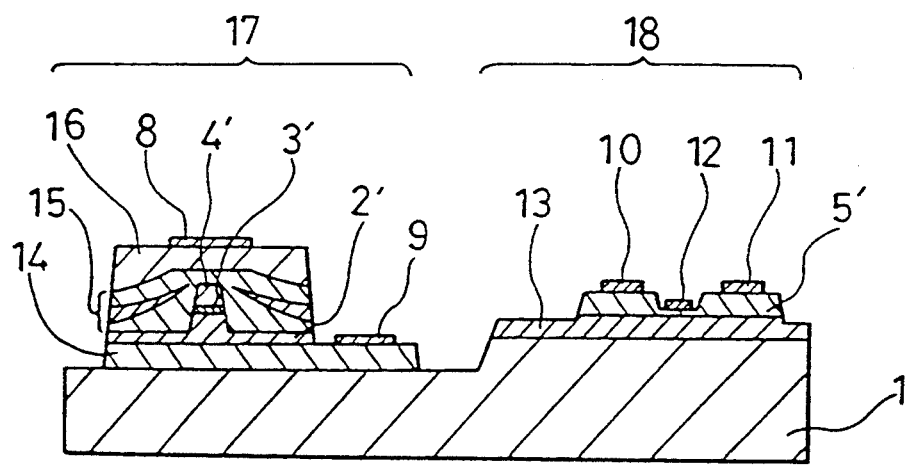
FIG. 3 is a cross-sectional view showing a long wavelength transmitter OEIC in accordance with the prior art.
Figure 4:
FIGS. 4(a) to 4(i) are cross-sectional views showing a method for manufacturing the long wavelength transmitter OEIC of FIG. 3.
Figure 4:
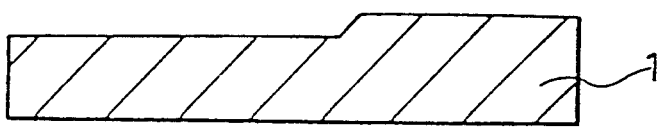
Figure 4:
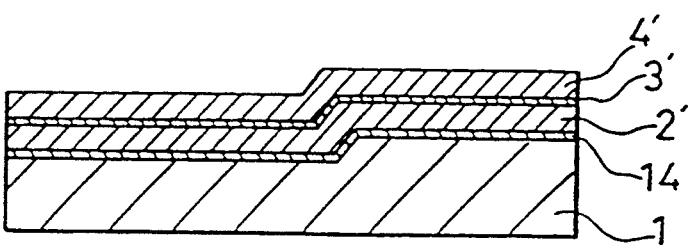
Figure 4:
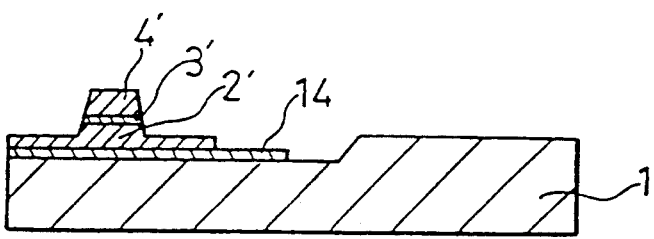
Figure 4:
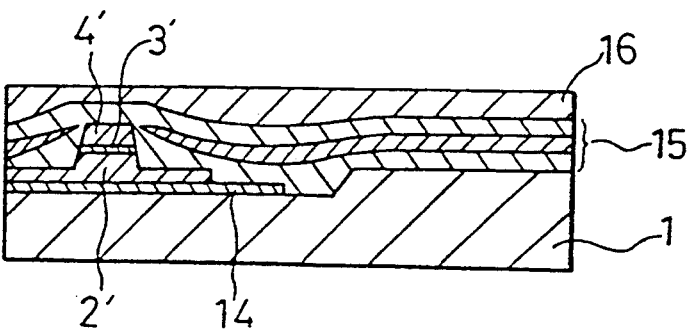
Figure 4F:
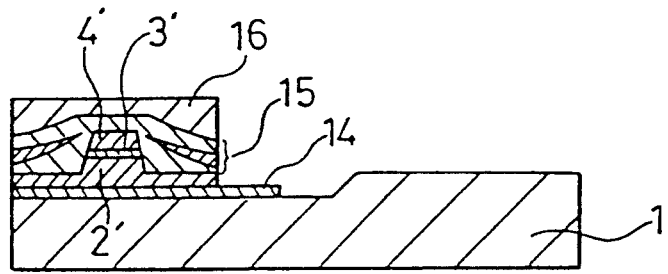
Figure 4G:
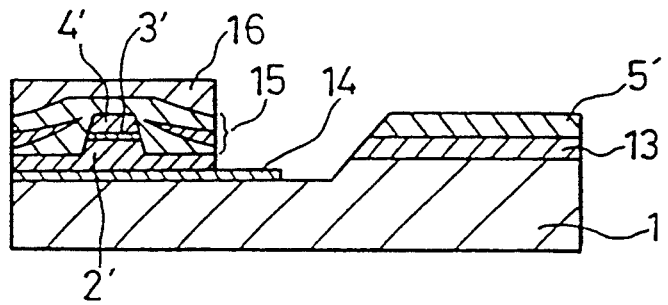
Figure 4H:
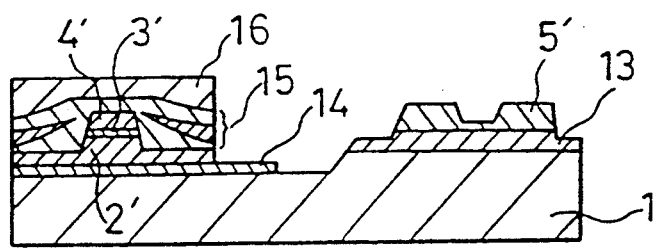
Figure 4I:
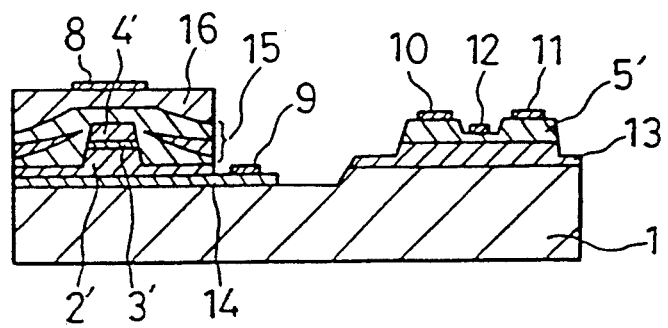

On a semi-insulating InP substrate 1 shown in FIG. 2(a), an AlGaInAs lower cladding layer 2, a quantum well active layer 3 comprising AlGaInAs or AlInAs barrier layers and a InGaAs well layer, a high resistivity AlGaInAs upper cladding layer 4, an undoped InGaAs operating layer 5, an n type AlInAs carrier supplying layer 6 and an n type InGaAs contact layer 7 are successively grown by MOCVD as shown in FIG. 2(b). Then, as shown in FIG. 2(c), p type dopant such as Zn is diffused or ion implanted from the surface of the growth layer to form a p type region 19. The p type dopant disorders part of the quantum well structure of the quantum well active layer 3, resulting in region 20 shown in FIG. 1(b). Then, as shown in FIG. 2(d), n type dopant such as Si is diffused or ion implanted from the surface at a predetermined interval from the p type region 19 to form an n type region 21. The n type dopant disorders part of the quantum well structure of quantum well active layer 3, resulting in region 22. Then, as shown in FIG. 2(e), a recess groove of the HEMT is formed by etching and then a gate electrode 12 is formed on the bottom of the recess groove. Then, as shown in FIG. 2(f), a groove 24 separating the p type region 19 from the n type region 21 and a groove 25 separating the semiconductor laser 17 from the HEMT 18 are formed by etching. Finally, p side and n side electrodes 8 and 9 of the semiconductor laser and source/drain electrodes 10 and 11 of the HEMT are formed, completing a transmitter OEIC.

Description is given of the operation hereinafter.

Operation of the semiconductor laser 17 will be described first. In the semiconductor laser 17, since an n type dopant such as Si and a p type dopant such as Zn are diffused from the surface of the epitaxy layers, the quantum well active layer 3 is disordered in the respective dopant diffused regions, resulting in the disordered regions 20 and 22 each having a larger effective energy band gap and smaller refractive index than those of the non-diffused region. When a positive voltage is applied to the p side electrode 8 and a negative voltage is applied to the n side electrode 9, a current only flows through the active layer 23 in the transverse direction because the upper and lower cladding layers 2 and 4 have high resistivities. Then, holes are injected into the active region 23 from the disordered region 20, electrons are injected into the active region 23 from the disordered region 22, and the holes and electrons recombine to generate light. When the current level is increased, induced emission takes place and then laser oscillation occurs. When the construction of the quantum well layer 3, i.e., the thickness of InGaAs well layer and the value of the effective energy band gap of AlGaInAs barrier layers are appropriately established, the oscillation wavelength can be set within a region of long wavelength from 1.3 to 1.55 micron in which the absorption loss of to optical fibers is small. Since the active region 23 is sandwiched by the disordered regions 20 and 22 having a small refractive index, the light is confined in the direction parallel to the active region 23. When the width of active region 23 is set to approximately 2 microns or less, fundamental transverse mode oscillation is obtained.

Description is given of the operation of the HEMT 18 hereinafter. In the HEMT 18, the InGaAs operating layer 5 is disposed directly on the high resistivity AlGaInAs layer 4, i.e., on the cladding layer of the semiconductor laser 17. It is necessary for HEMT to have a high resistivity buffer layer beneath the operating layer to reduce the leakage current. In the present invention, the high resistivity cladding layer of the semiconductor laser 17 also serves as the leakage current preventing layer of the HEMT 18. The principle of operation of HEMT 18 is as same as that of a conventional HEMT. More specifically, electrons are supplied from the AlInAs charge carrier supplying layer 6 to the InGaAs operating layer 5 having low impurity concentration (approximately $10^{15}$ cm$^{-3}$ or less) and less impurity dispersion, and a two-dimensional electron gas is generated at the interface between the operating layer 5 and the carrier supplying layer 6. When the voltage applied to the gate electrode 12 is varied, the level and shape of potential in the vicinity of the interface between the operating layer 5 and the carrier supplying layer 6 vary accordingly, and the concentration of the two-dimensional electron gas also varies. That is, the current is subjected to a modulation by the variation of the gate voltage.

The transmitter OEIC of the present invention, in which the semiconductor laser 17 and the HEMT 18 are integrated on a substrate 1, operates with the n side electrode 9 of the semiconductor laser connected to the source electrode 10 of the HEMT by wiring. Thus, the HEMT 18 controls the operating current of semiconductor laser 17 and modulates the brightness or strength of the light output from the semiconductor laser 17.

As described above, in the present invention, a transverse direction current injection type semiconductor laser having a high resistivity upper cladding layer and an HEMT having an operating layer on the high resistivity upper cladding layer are integrated on a substrate. More specifically, the semiconductor laser includes an AlGaInAs lower cladding layer, a quantum well active layer and a high resistivity AlGaInAs upper cladding layer successively grown on the substrate, disordered regions formed in the quantum well active layer by diffusions of p type and n type dopants, and an active region sandwiched by the disordered regions. The HEMT includes an operating layer formed on the high resistivity AlGaInAs upper cladding layer and use the upper cladding layer as a leakage current preventing layer. Therefore, it is not necessary to provide a special leakage current preventing film for the HEMT. In addition, the above structure is formed by only one epitaxial growth step. As a result, the epitaxial process is simplified and the costs are reduced. Furthermore, since the crystals for the semiconductor laser and those for the HEMT are successively grown on a flat substrate having no step difference, photolithography can be performed on a flat surface with no step difference in forming a gate of HEMT, so that a gate of the 1 micron or less can be easily and precisely formed. As a result, a transmitter OEIC with high speed modulation can be realized. In addition, since AlGaInAs series material is used in the present invention, the oscillation wavelength of the semiconductor laser can be set within a long region of 1.3 to 1.55 micron in which the absorption loss of optical fibers is small, and a high speed HEMT can be constituted. In addition, such a long wavelength semiconductor laser operating from 1.3 to 1.55 micron wavelength and a high speed InGaAs/AlInAs series HEMT can be easily integrated on an InP substrate, resulting in an increased high speed transmitter OEIC.

What is claimed is:

1. A long wavelength transmitter OEIC comprising:
   a semi-insulating InP substrate;
   an AlGaInAs lower cladding layer, a quantum well active layer, a high resistivity AlGaInAs upper cladding layer, an undoped InGaAs operating layer, an n type AlInAs charge carrier supplying layer, and an n type InGaAs contact layer successively disposed on said semi-insulating InP substrate;
   a p type region penetrating through said layers from said contact layer to said quantum well active layer and reaching into said lower cladding layer;
   an n type region spaced a predetermined interval from said p type region, penetrating through said layers from said contact layer to said quantum well active layer, and reaching into said lower cladding layer;
   a p side electrode in communication with said p type region;
   an n side electrode in communication with said n type region;
   a recess groove spaced from said p and n type regions, penetrating through said contact layer, and reaching into said charge carrier supplying layer;
   a gate electrode disposed on said charge carrier supplying layer in said recess groove;
   source and drain electrodes disposed on said contact layer at opposite sides of the recess groove;
   a first separation groove separating said p type region from said n type region, penetrating through said layers from said contact layer to said operating layer, and reaching said high resistivity AlGaInAs upper cladding layer; and
   a second separation groove separating said n and p type regions from said source and drain electrodes, penetrating through said layers from said contact layer to said operating layer, and reaching into said high resistivity AlGaInAs upper cladding layer.

2. A long wavelength transmitter OEIC in accordance with claim 1 wherein said AlGaInAs lower cladding layer, said quantum well active layer, said high resistivity AlGaInAs charge upper cladding layer, said undoped InGaAs operating layer, said n type AlInAs carrier supplying layer and said n type InGaAs contact layer are successively grown by metal-organic chemical vapor deposition.

3. A long wavelength transmitter OEIC in accordance with claim 1 wherein said p type region contains Zn and said n type region contains Si.

4. A long wavelength transmitter OEIC in accordance with claim 1 wherein said p type region is formed by diffusion or ion implantation of a p type dopant.

5. A long wavelength transmitter OEIC in accordance with claim 1 wherein said n type region is formed by diffusion or ion implantation of a n type dopant.

6. A long wavelength transmitter OEIC in accordance with claim 1 wherein said quantum well active layer comprises one of AlGaInAs and AlInAs barrier layers and a InGaAs well layer.

7. A long wavelength transmitter OEIC in accordance with claim 6 wherein the oscillation wavelength of said quantum well active layer is 1.3 to 1.55 micron.

* * * * *